(12) United States Patent
Kim et al.

(10) Patent No.: US 6,780,463 B2
(45) Date of Patent: Aug. 24, 2004

(54) METHOD OF FORMING A MOCVD-TIN THIN FILM

(75) Inventors: Byoung-Youp Kim, Yongin-shi (KR); Hyung-Seok Kim, Seoul (KR)

(73) Assignee: Jusung Engineering Co., Ltd., Kyonggi-di (KR)

( * ) Notice: Subject to any disclaimer, the term of this patent is extended or adjusted under 35 U.S.C. 154(b) by 108 days.

(21) Appl. No.: 09/927,003

(22) Filed: Aug. 8, 2001

(65) Prior Publication Data

US 2002/0022089 A1 Feb. 21, 2002

(30) Foreign Application Priority Data

Aug. 11, 2000 (KR) ........................................ 2000-46691

(51) Int. Cl.⁷ .............................................. C23C 16/34
(52) U.S. Cl. .............................. 427/248.1; 427/255.394
(58) Field of Search ....................... 427/248.1, 255.374; 488/689

(56) References Cited

U.S. PATENT DOCUMENTS 5,672,385 A * 9/1997 Jimba et al. ............. 427/248.1
6,069,072 A * 5/2000 Konecni et al. ............ 438/642
6,080,446 A * 6/2000 Tobe et al. ........... 427/255.394

* cited by examiner

*Primary Examiner*—Timothy Meeks
(74) *Attorney, Agent, or Firm*—Timothy J. Keefer; Seyfarth Shaw LLP

(57) ABSTRACT

The present invention discloses a method of forming a titanium nitride (TiN) thin film on a substrate disposed on a susceptor in a reaction chamber with low carbon content, low resistivity, and excellent step coverage. The method forming the TiN thin film includes feeding vapor of a Tetrakis Diethylamino Titanium (TDEAT) precursor and ammonia ($NH_3$) gas into the reaction chamber, wherein a ratio of a vaporization rate of the TDEAT precursor to a flow rate of the ammonia gas is a value in the range of 1 mg/min:20 sccm to 1 mg/min:100 sccm; maintaining an atmosphere in the reaction chamber at a pressure in the range of 0.5 to 3.0 Torr; and heating the substrate to a temperature in the range of 300 to 400 degrees Celsius (° C.).

16 Claims, 5 Drawing Sheets

METHOD OF FORMING A MOCVD-TIN THIN FILM

CROSS REFERENCE TO RELATED APPLICATION

This application claims the priority of Korean patent application Serial No. 2000-46691 filed on Aug. 11, 2000.

This application claims the benefit of Korean Patent Application No. 2000-46691, filed on Aug. 11, 2000, under 35 U.S.C. § 119, the entirety of which is hereby incorporated by reference.

BACKGROUND OF THE INVENTION

1. Field of the Invention

The present invention relates to a method of forming a titanium nitride (TiN) thin film, and more particularly, to a MOCVD (Metal Organic Chemical Vapor Deposition) method using TDEAT (Tetrakis Diethylamino Titanium) as a precursor.

2. Description of Related Art

A titanium nitride (TiN) film is usually formed by a sputtering method due to the fact that this method results in excellent film characteristics and has simplicity in the process. However, as microelectronics devices have become integrated, the TiN thin film requires superior step coverage. Therefore, a CVD (Chemical Vapor Deposition) method that uses $TiCl_4$ and $NH_3$ as reaction gas is developed. Although the TiN thin film formed by CVD (referred to as CVD-TiN) which employs $TiCl_4$ has the superior step coverage, a process temperature of this CVD should be equal to or more than 600 degrees Celsius (° C.) in order to make TiN thin film include a low chlorine (Cl) content. Therefore, this CVD method employing $TiCl_4$ is not adequate to a TiN thin film of a multi-layer line formation process or a Dow temperature process.

Accordingly, a metal organic CVD-TiN (MOCVD-TiN) deposition process which can process TiN thin film at a low temperature is researched and developed. A precursor for use in the MOCVD-TiN deposition process is usually Tetrakis DiMethylAmido Titanium (TDMAT, $Ti[N(CH_3)_2]_4$), Tetrakis DiEthylAmido Titanium (TDEAT, $Ti[N(C_2H_5)_2]_4$) or Tertakis EthylMethylAmido Titanium (TEMAT, $Ti[N(C_2H_5)_2]_4$). However, the TiN thin film contains a lot of carbon when depositing these precursors via thermal decomposition. In order to overcome this problem, various methods are researched and developed.

For example, in a case that TDMAT is used as the precursor, $N_2$ or $H_2$ plasma processing is conducted after TiN thin film is deposited. Namely, when the precursor is TDMAT, ammonia ($NH_3$) gas easily reacts with TDMAT vapor and a carbon content in the TiN thin film decreases, thereby lowering firmness and stability of the TiN thin film. Therefore, the additional $N_2$ or $H_2$ plasma processing is required to improve the quality of the TiN thin film. However, some problems occur in this process. Since the plasma processing is necessary for the TiN thin film, a lot of particles are produced in a reaction chamber, and additionally, a process time is prolonged. Furthermore, the plasma processing is nonproperty conducted inside a contact hole. Thus, the TiN thin film quality in the contact hole is not so good when forming the TiN thin film into the contact hole. These demerits occurring in the contact hole will be more conspicuous as the contact hole diminishes in size.

In a case that TDEAT is used as a precursor, a TiN thin film has better quality than that in a case that TDMAT is used as the precursor. However, there are some limitations in use of TDEAT as a precursor. U.S. Pat. No. 5,139,825 discloses that the TiN thin film is formed in a wary of using transition metal amido compound as a precursor and using ammonia ($NH_3$) gas. However, a process temperature is limited in the range of 100 to 400 degrees Celsius (° C.). Furthermore, the process is operated at a pressure less than atmospheric pressure.

Additionally, U.S. Pat. No. 5,672,385 discloses that the thin film is formed using ammonia ($NH_3$) gas and using TDEAT as a precursor. However, the pressure in the reactor is controlled at a value in the range of about 0.00075 to 0.1125 Torr. Further, according to the data shown in U.S. Pat. No. 5,672,385, although the step coverage is more or less improved, the resistively of the thin film is not improved.

FIG. 1 is a schematic diagram illustrating a conventional TiN thin film deposition apparatus that adopts a shower bead. As shown in FIG. 1, the conventional apparatus supplies vapor of a TDEAT precursor and ammonia ($NH_3$) gas through the shower head 20 in order to form a TiN thin film. In other words, the TDEAT vapor and the ammonia ($NH_3$) gas flow into a reaction chamber 10 through the shower head 20 that is disposed in a corresponding position over a susceptor 30. Then these vapor and gas are exhausted through an exhaust pipe 50 that is arranged at a bottom portion of the reaction chamber 10. A substrate 40 is put on the susceptor 30 and the TiN thin film is formed by reaction between the TDEAT vapor and the ammonia ($H_3$) gas. Additionally, a heater (not shown) is installed in the susceptor 30 to form the TiN thin film on the substrate 40.

In the conventional TiN thin film deposition apparatus, however, there are some problems when using the shower head 20 as a gas injection device. For example, since the gas ejected from the shower head 20 directly moves towards and reaches the substrate 40, a lot of particles are generated in accordance with a sudden change of temperature. Furthermore, since the shower head 20 is close to and faces to the substrate 40 having the heater (not shown), the shower head 20 has a high temperature and it is very difficult to control a temperature of the shower head 20 independently.

SUMMARY OF THE INVENTION

Accordingly, the present invention is directed to a MOCVD (Metal Organic Chemical Vapor Deposition) method that substantially overcomes one or more of the problems due to limitations and disadvantages of the related art.

To overcome the problems described above, the present invention provides a MOCVD method using TDEAT as a precursor to form a titanium nitride (TiN) thin film on a substrate.

An object of the present invention is to provide a MOCVD method that forms a TiN thin film at a low temperature and that makes the TiN thin film include a low carbon content.

Another object of the present invention is to provide a MOCVD method that forms a TiN thin film having low resistivity and superior step coverage.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

In order to achieve the above object, a method of forming a titanium nitride (TiN) thin film on a substrate disposed on a susceptor in a reaction chamber, includes feeding vapor of a Tetrakis Diethylamino Titanium (TDEAT) precursor and ammonia ($NH_3$) gas into the reaction chamber, wherein a ratio of a vaporization rate of the TDEAT precursor to a flow rate of the ammonia gas is a value in the range of 1 mg/min:20 sccm to 1 mg/min:100 sccm; maintaining an atmosphere in the reaction chamber at a pressure in the range of 0.5 to 3.0 Torr; and heating the substrate to a temperature in the range of 300 to 400 degrees Celsius (° C.).

In this method, the substrate is heated up to a temperature in the range of 320 to 380 degrees Celsius (° C.). The atmosphere in the reaction chamber bias a pressure in the range of 0.5 to 1.5 Torr.

The method of forming a titanium nitride (TiN) thin film further includes supplying a carrier gas, such as argon (Ar) and helium (He), into the reaction chamber at a flow rate in the range of 100 to 1000 sccm.

The method of forming a titanium nitride (TiN) thin film further includes vaporizing the TDEAT precursor before the TDEAT precursor is fed into the reaction chambers At this time, the TDEAT precursor is vaporized at a vaporization rate in a range of 10 to 50 mg/min. Additionally, the ammonia gas is fed to the reaction chamber at a flow rate in the range of 500 to 3000 sccm.

When using the above-mentioned method, the reaction chamber is a dome-shaped top portion and includes a plurality of gas injectors that supply the TDEAT vapor and the ammonia gas to the reaction chamber in an upward direction from the bottom to top portion of the reaction chamber. Additionally, the TDEAT vapor and the ammonia gas are respectively supplied by the different gas injectors.

The reaction chamber includes a heat exchanger on an outer surface thereof in order to maintain a top portion of the reaction chamber at a temperature in the range of 50 to 150 degrees Celsius (° C.). Advisably, the heat exchanger maintains a top portion of the reaction chamber at a temperature in the range of 80 to 100 degrees Celsius (° C.), Furthermore, the heat exchanger can maintain a wall of the reaction chamber at a temperature in the range of 50 to 150 degrees Celsius (° C.). Advisably, the heat exchanger maintains a wall of the reaction chamber at a temperature in the range of 80 to 100 degrees Celsius (° C.), It is to be understood that both the foregoing general description and the following detailed description are exemplary and explanatory and are intended to provide further explanation of the invention as claimed.

The accompanying drawings are included to provide a further understanding of the invention and are incorporated in and constitute a part of this specification, illustrate one embodiment of the invention and together with the description serve to explain the principles of the invention.

BRIEF DESCRIPTION OF THE DRAWINGS

The accompanying drawings, which are included to provide a further understanding of the invention and are incorporated in and constitute a pact of this application, illustrate embodiment of the invention and together with the description serve to explain the principle of the invention.

In the drawings.

DETAILED DESCRIPTION OF ILLUSTRATED EMBODIMENTS

Reference will now be made in detail to illustrated embodiment of the present invention, examples of which are shown in the accompanying drawings. Wherever possible, the same reference numbers will be used throughout the drawings to refer to the same or like parts.

Figure 1:
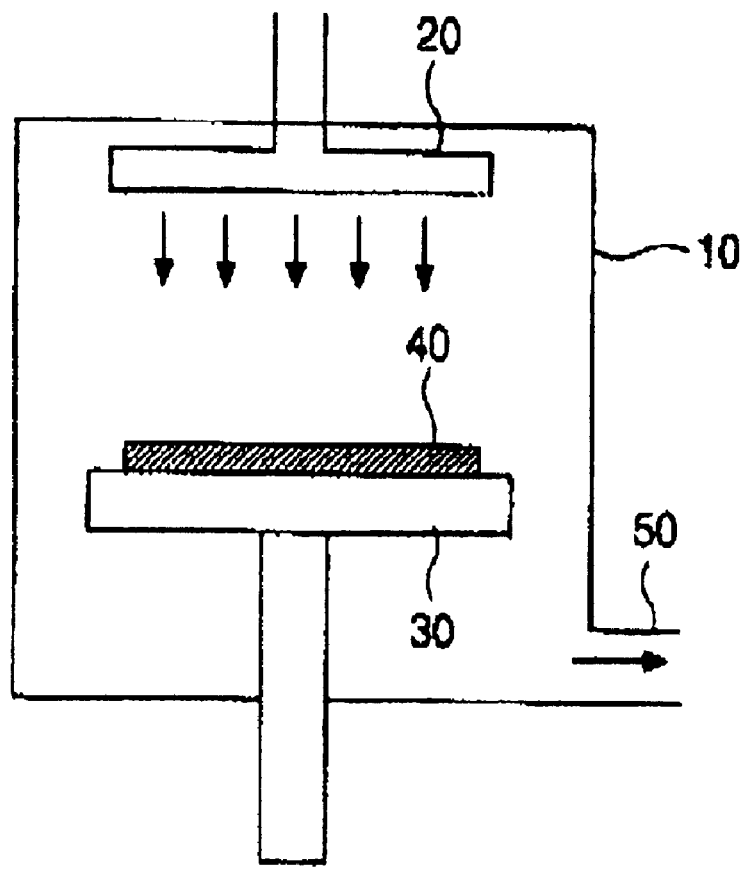
FIG. 1 is a schematic diagram illustrating a conventional titanium nitride (TiN) thin film deposition apparatus that adopts a shower head.
Figure 2:
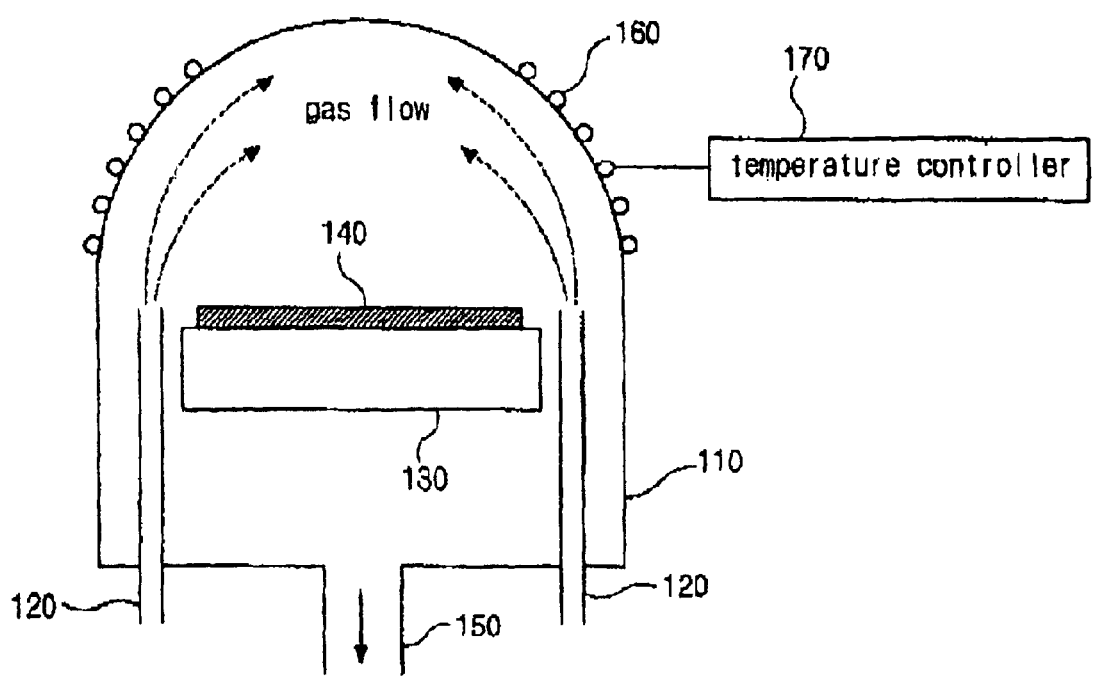
FIG. 2 is a schematic diagram illustrating a titanium nitride (TiN) thin film deposition apparatus according to the present invention.

FIG. 2 is a schematic diagram illustrating a titanium nitride (TiN) thin film deposition apparatus according to the present invention. As shown in FIG. 2, a reaction chamber 110 has a dome shape at a top portion. A heat exchanger 160 is disposed on an outer surface of the reaction chamber 110, especially around the dome-shaped top portion of the reaction chamber 110. This heat exchanger 160 is maintained at a determined temperature by a temperature controller 170. A susceptor 130 is arranged inside the reaction chamber 110 and a substrate 140 is disposed on the susceptor 130. Further, the susceptor 130 includes a heater (not shown) therein, thereby applying heat to the substrate 140.

Still referring to FIG. 2, a plurality of gas injectors 120 are arranged in the reaction chamber 110, especially around the susceptor 130. The plurality of gas injectors 120 penetrate a bottom portion of the reaction chamber 110 and elongate along the side wall of the reaction chamber 110. A gas exhaust pipe 150 is positioned in the bottom portion of the reaction chamber 110.

In FIG. 2, vapor of a TDEAT precursor and ammonia ($NH_3$) gas are respectively ejected from the different gas injectors 120 into the reaction chamber 110. Since the TDEAT vapor and the ammonia ($NH_3$) gas are injected into the reaction chamber 110 in an upward direction, these vapor and gas impact against the dome-shaped top portion of the reaction chamber 110 and are guided along the top wall to the central part of the reaction chamber 110. At this time, the substrate 140 is heated up to a temperature of about 300 to 400 degrees Celsius (° C.) using a heater (not shown) installed in the susceptor 130, and a pressure in the reaction chamber 110 is maintained at a value in the range of about 0.5 to 3.0 Torr. Furthermore, the heat exchanger 160 provided on the outer wall of the reaction chamber 110 maintains the wall of the reaction chamber 110 at a temperature of 50 to 150 degrees Celsius ° (C.). Advisably, the temperature of the substrate 140 is about 320 to 380 degrees Celsius (° C.), the pressure in the reaction chamber 110 is about 0.5 to 1.5 Torr, and the temperature of the wall of the reaction chamber 110 is about 80 to 100 degrees Celsius (° C.). Since the gas ejected from the plurality of gas injectors 120 at first reaches the top portion or wall of the reaction chamber 110, a lot of particles can be produced if the top portion or wall of the reaction chamber 110 is too hot or too cold. Therefore, it is important to maintain the top portion or wall of the reaction chamber at a proper temperature ill order to prevent occurring the particles.

The TDEAT is vaporized and then supplied to the reaction chamber at a flow rate of 10 to 50 mg/min. The ammonia (NH$_3$) gas is then fed into the reaction chamber 110 at a flow rate of 500 to 3000 standard cubic centimeters per minute (sccm). At this time, a ratio of the vaporization rate of the TDEAT precursor to the flow rate of the ammonia (NH$_3$) gas is beneficially from 1 mg/min to 20 sccm to 1 mg/min to 100 sccm (1 mg/min:20 sccm~1 mg/min:100 sccm). Furthermore, argon (Ar) or helium (He) gas, as a carrier gas, can further be fed to the reaction chamber 110 at a flow rate of 100 to 1000 sccm. When using the argon (Ar) or helium (He) as a carrier gas, the flow rate of this carrier gas is advisably 200 to 500 sccm.

Figure 3:
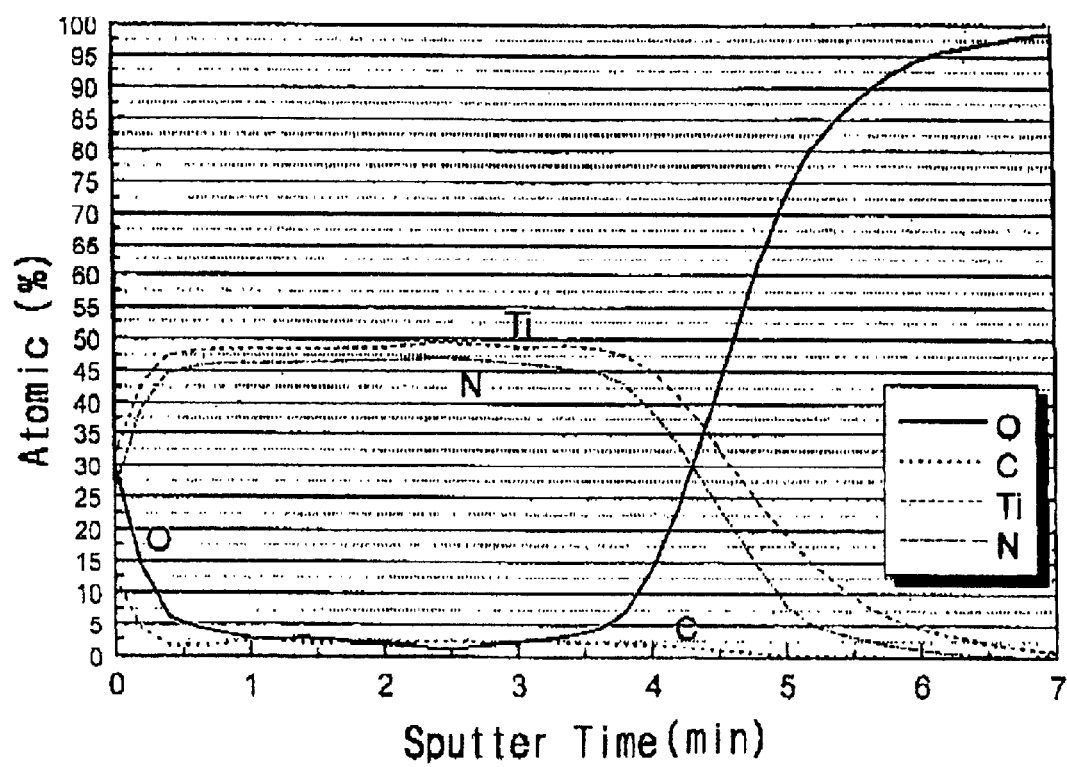
FIG. 3 is a graph showing the dependence of atomic composition on the depth of a deposited TiN thin film according to the present invention.

FIG. 3 is a graph showing the dependence of atomic composition on the depth of a deposited TiN thin film according to the present invention. As shown in FIG. 3, a ratio of titanium (Ti) to nitrogen (N) is 1 to 1 in the TiN thin film, and a carbon (C) content in the TiN thin film is very low.

Figure 4:
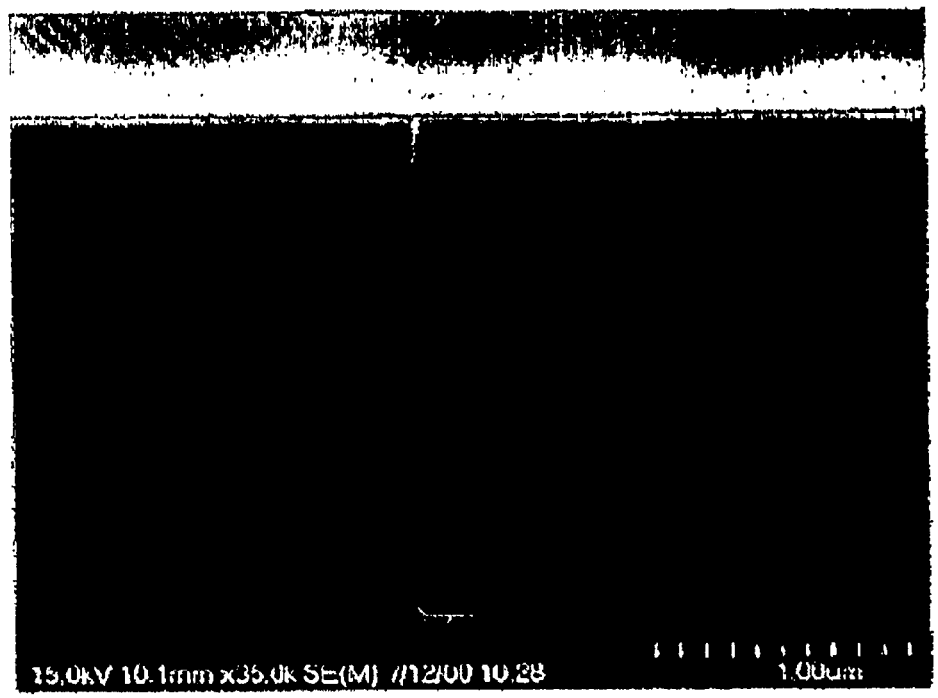
FIG. 4 is a scanning electron microscopy (SEM) photograph of a cross-section of a TiN thin film according to the present invention.

FIG. 4 is a scanning electron microscopy (SEM) photograph of a cross-section of a TiN thin film according to the present invention. In order to take the SEM photograph, a contact hole that has a diameter of about 0.35 micrometers ($\mu$m) and an aspect ratio of 7:1 is first formed and then the TiN tun film is deposited. As shown in FIG. 4, the thickness distribution of the titanium nitride (TiN) thin film is improved according to the present invention. Namely, the thicknesses of the TiN thin film are about 160 angstroms (Å) on the substrate, about 130 angstroms (Å) on a side wall of the contact hole, and about 110 angstroms (Å) on a bottom of the contact hole. Therefore, the TiN thin film according to the present invention delivers excellent step coverage that is defined as a ratio of the thickness of the deposit on the side wall or bottom of the contact hole to the thickness of the deposit on the substrate. In other words, the step coverage is 81% (130/160×100%) in the side wall of the contact hole, and the step coverage is 70% (110/160×100%) in the bottom of the contact hole.

Figure 5:
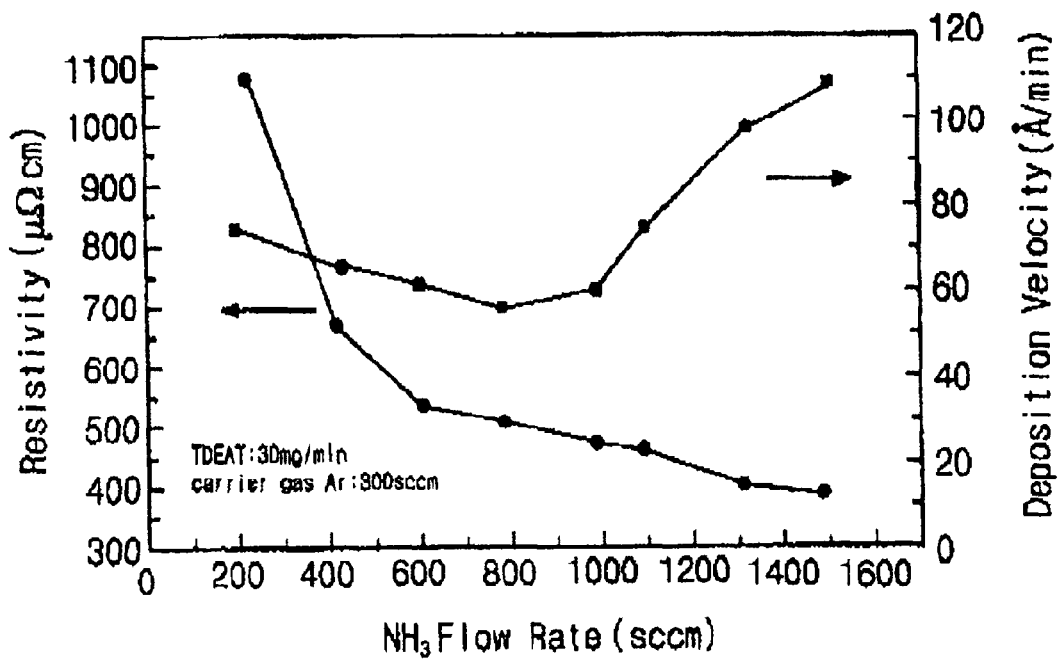
FIG. 5 is a graph showing the dependence of resistivity on the ammonia ($NH_3$) flow rate and the dependence of deposition velocity on the ammonia ($NH_3$) flow rate according to the present invention.

FIG. 5 is a graph showing the dependence of resistivity on the ammonia (NH$_3$) flow rate and the dependence of deposition velocity on the ammonia (NH$_3$) flow rate according to the present invention. The TDEAT precursor was vaporized at a rate of 30 mg/min and then fed to the reaction chamber. Further, the argon (Ar) gas was used as a carrier gas and fed into the reaction chamber at a flow rate of 300 sccm while varying a flow rate of the ammonia (NH$_3$) gas. As shown in FIG. 5, at the time when the flow rate of the ammonia (NH$_3$) gas is 600 sccm, in other words, at the time when a ratio of the vaporization rate of the TDEAT precursor to the flow rate of the ammonia (NH$_3$) gas is about 1 mg/min to 200 sccm (1 mg/min:20 sccm), the resistivity of the TiN thin film sufficiently decreases at a value of equal to or less than 550 $\mu\Omega$cm.

As described above, the method according to the present invention provides forming a TiN thin film using the TDEAT precursor and ammonia gas. The TiN thin film deposited using this MOCVD method bas low carbon content, low resistivity, and excellent step coverage although this TiN thin film is formed at a relative low temperature. Especially, since both the vapor of TDEAT precursor and the ammonia gas are ejected from the plurality of gas injectors to the dome-shaped top portion of the reaction chamber, the quality of TiN thin film, such as low carbon content, low resistivity and excellent step coverage, is optimized.

It will be apparent to those skilled in the art that various modifications and variations can be made in the capacitor and the manufacturing method thereof of the present invention without departing from the spirit or scope of the inventions. Thus, it is intended that the present invention cover the modifications and variations of this invention provided they come within the scope of the appended claims and their equivalents.

What is claimed is:

1. A method of forming a titanium nitride thin film on a substrate disposed on a susceptor in a reaction chamber, comprising:

feeding vapor of a Tetrakis Diethylamino Titanium (TDEAT) precursor and ammonia (NH$_3$) gas into the reaction chamber, wherein a ratio of a vaporization rate of the TDEAT precursor to a flow rate of the ammonia gas is a value in the range of 1 mg/mm: 20 sccm to 1 mg/min: 100 sccm;

maintaining an atmosphere in the reaction chamber at a pressure in the range of 0.5 to 3.0 Torr;

heating the substrate to a temperature in the range of 300 to 400 degrees Celsius (° C.); and vaporizing the TDEAT precursor before the TDEAT precursor is fed into the reaction chamber, wherein the TDEAT precursor is vaporized at a vaporization rate in a range of 10 to 50 mg/min.

2. The method of claim 1, wherein the substrate is heated up to a temperature in the range of 320 to 380 degrees Celsius. (° C.).

3. The method of claim 1, wherein the atmosphere in a reaction chamber has a pressure in the range of 0.5 to 1.5 Torr.

4. The method of claim 1, further comprising supplying a carrier gas into the reaction chamber.

5. The method of claim 4, wherein the carrier gas is an inert gas selected from a group consisting of argon (Ar) and helium (He).

6. The method of claim 4, wherein the carrier gas is supplied at a flow rate in the range of 100 to 1000 sccm.

7. The method of claim 1, wherein the ammonia gas if fed to the reaction chamber at a flow rate in the range of 500 to 3000 sccm.

8. The method of claim 1, wherein the reaction chamber has a dome-shaped top portion and includes a plurality of gas injectors.

9. The method of claim 8, wherein the plurality of gas injectors supply the TDEAT vapor and the ammonia gas to the reaction chamber.

10. The method of claim 9, wherein the TDEAT vapor and the ammonia gas are supplied in an upward direction from the bottom to top portion of the reaction chamber.

11. The method of claim 9, wherein the TDEAT vapor and the ammonia gas are respectively supplied by the different gas injectors.

12. The method of claim 1, wherein the reaction chamber includes, heat exchanger on an outer surface thereof.

13. The method of claim 12, wherein the heat exchanger maintains a top portion of the reaction chamber at a temperature in the range of 50 to 150 degrees Celsius (° C.).

14. The method of claim 13, wherein the heat exchanger maintains a top portion of the reaction chamber at a temperature in the range of 80 to 100 degrees Celsius (° C.).

15. The method of claim 12, wherein the heat exchanger maintains a wall of the reaction chamber at a temperature in the range of 50 to 150 degrees Celsius (° C.).

16. The method of claim 15, wherein the heat exchanger maintains a wall of the reaction chamber at a temperature in the range of 80 to 100 degrees Celsius (° C.).

* * * * *